(12) United States Patent
Kim et al.

(10) Patent No.: US 9,000,625 B1
(45) Date of Patent: Apr. 7, 2015

(54) LINEAR TRANSFORMER DRIVER FOR PULSE GENERATION

(75) Inventors: Alexander A. Kim, Tomsk (RU); Michael G. Mazarakis, Albuquerque, NM (US); Vadim A. Sinebryukhov, Tomsk (RU); Sergey N. Volkov, Tomsk (RU); Sergey S. Kondratiev, Tomsk (RU); Vitaly M. Alexeenko, Tomsk (RU); Frédéric Bayol, Thegra (FR); Gauthier Demol, Thegra (FR); William A. Stygar, Albuquerque, MN (US)

(73) Assignee: Sandia Corporation, Albuquerque, NM (US)

( * ) Notice: Subject to any disclaimer, the term of this patent is extended or adjusted under 35 U.S.C. 154(b) by 544 days.

(21) Appl. No.: 13/530,403

(22) Filed: Jun. 22, 2012

(51) Int. Cl.
*H03K 6/00* (2006.01)
*H03K 6/02* (2006.01)

(52) U.S. Cl.
CPC .................................. *H03K 6/00* (2013.01)

(58) Field of Classification Search
USPC ........................................................ 307/412
See application file for complete search history.

(56) References Cited

PUBLICATIONS

Mazarakis, M. G. et al., "High current, 0.5-MA, fast, 100-ns, linear transformer driver experiments," Physical Review Special Topics—Accelerators and Beams 12, 050401 (2009) The American Physical Society, pp. 1-10.
Kim, A. A., et al., "Square pulse linear transformer driver," Physical Review Special Topics—Accelerators and Beams 15, 040401 (2012) Published by the American Physical Society, pp. 1-7.

*Primary Examiner* — Robert Deberadinis
(74) *Attorney, Agent, or Firm* — Blakely Sokoloff Taylor & Zafman

(57) ABSTRACT

A linear transformer driver includes at least one ferrite ring positioned to accept a load. The linear transformer driver also includes a first power delivery module that includes a first charge storage devices and a first switch. The first power delivery module sends a first energy in the form of a first pulse to the load. The linear transformer driver also includes a second power delivery module including a second charge storage device and a second switch. The second power delivery module sends a second energy in the form of a second pulse to the load. The second pulse has a frequency that is approximately three times the frequency of the first pulse. The at least one ferrite ring is positioned to force the first pulse and the second pulse to the load by temporarily isolating the first pulse and the second pulse from an electrical ground.

21 Claims, 8 Drawing Sheets

LINEAR TRANSFORMER DRIVER FOR PULSE GENERATION

This invention was made with Government support under Contract No. DE-AC04-94AL85000 between Sandia Corporation and the U.S. Department of Energy. The U.S. Government has certain rights in this invention.

TECHNICAL FIELD

This disclosure relates generally to pulse generation and in particular but not exclusively, relates to linear transformer drivers that generate square pulses.

BACKGROUND INFORMATION

Linear Transformer Drivers ("LTD") are a class of accelerators that are capable of generating high current, high voltage pulses. High power pulses are useful in applications such as high current Z-pinch inertial confinement fusion ("ICF"), Z-pinch inertial fusion energy ("IFE") drivers, flash radiography, and high-power microwaves. One approach to making an LTD includes constructing an array of power delivery modules that are connected in parallel. An accelerator cavity encloses the array of power delivery modules and a load is positioned within a core at the center of the cavity to receive high power pulses generated by the array of power delivery modules.

In this arrangement, a high power pulse is created by switching the power delivery modules and inductively adding the pulses at (relatively) low voltage through low inductance transfer and soft iron or other ferromagnetic material core isolation. Although this configuration is capable of generating high power pulses, the pulses are generally sine shaped output pulses that may not be well suited for some applications. For example, in radiography, a pulse with a fixed voltage (flat top) is desired. Hence, a more suitable power pulse would have a flat or trapezoidal (rising or falling) top. Therefore, an LTD that could generate high power pulses that also had flat or trapezoidal tops is desirable.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an apparatus and method for generating pulses with a linear transformer driver ("LTD") are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
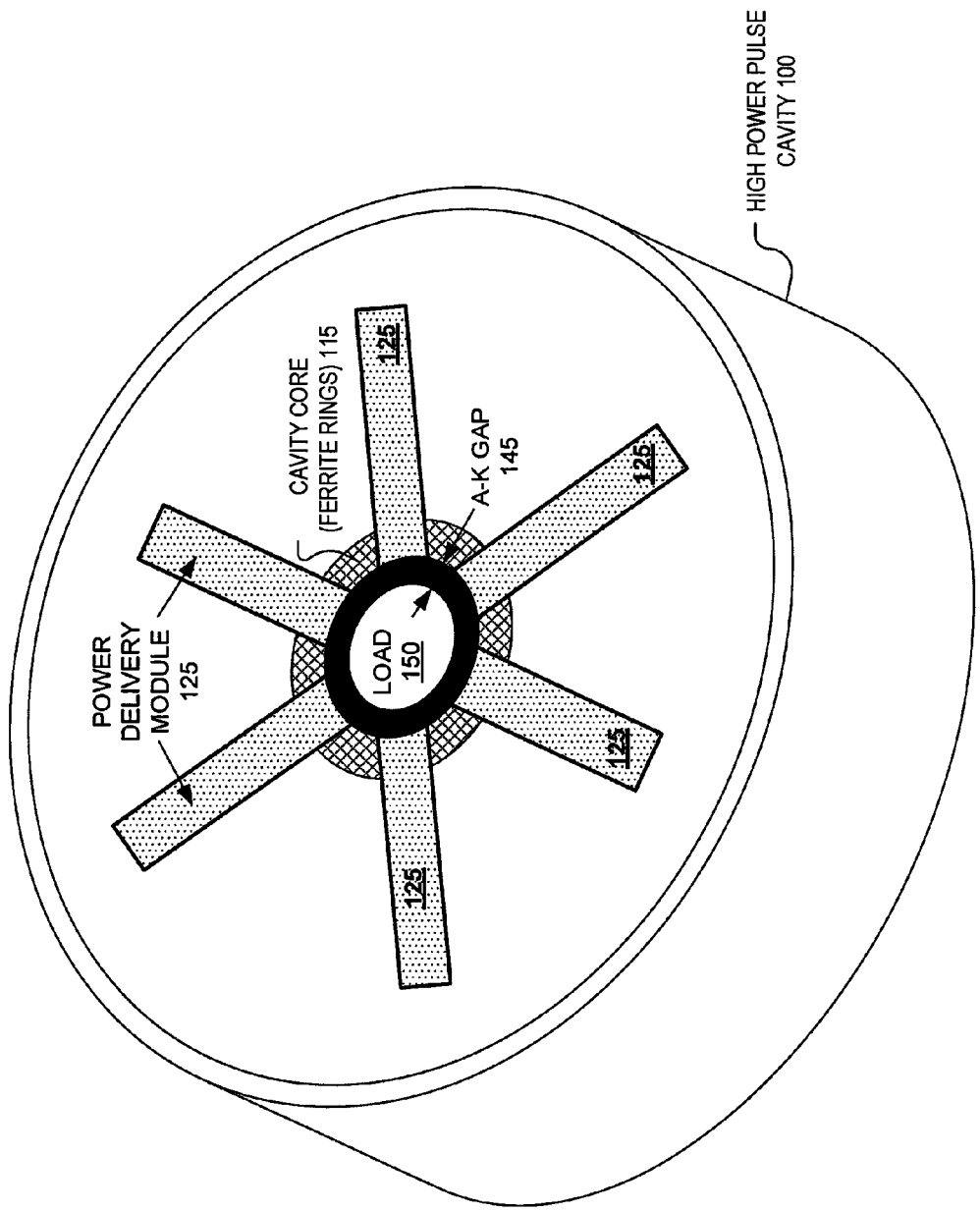
FIG. 1A illustrates a diagram of a high power pulse cavity ("HPPC") that contains a circular array of power delivery modules.

FIG. 1A includes a high power pulse cavity ("HPPC") 100 that contains a circular array of power delivery modules 125. In the illustrated embodiment, HPPC 100 is substantially doughnut shaped and includes a cavity core 115 at the center of high power pulse cavity 100. Cavity core 115 may be made out of ferrite rings. In one embodiment, cavity core 115 includes six ferrite rings. Load 150 is positioned in cavity core 115 and each of the power delivery modules 125 are connected in parallel to deliver pulses to load 150.

More than one HPPC 100 can be positioned together in order to form a voltage adder. In this way, higher voltages can be achieved by inductively adding many stages in series. In one embodiment, HPPC 100 has steel walls and the steel walls are grounded at all times. Grounding the outside of the cavity may dramatically reduce the electrical hazard associated with the high power nature HPPC 100. Additionally, the steel walls reduce or even virtually eliminate electro-magnetic power ("EMP") radiation from escaping HPPC 100. HPPC 100 may have a top metal cover and a plastic insulator for insulating charged parts of the power delivery modules from the cavity walls.

Figure 1B:
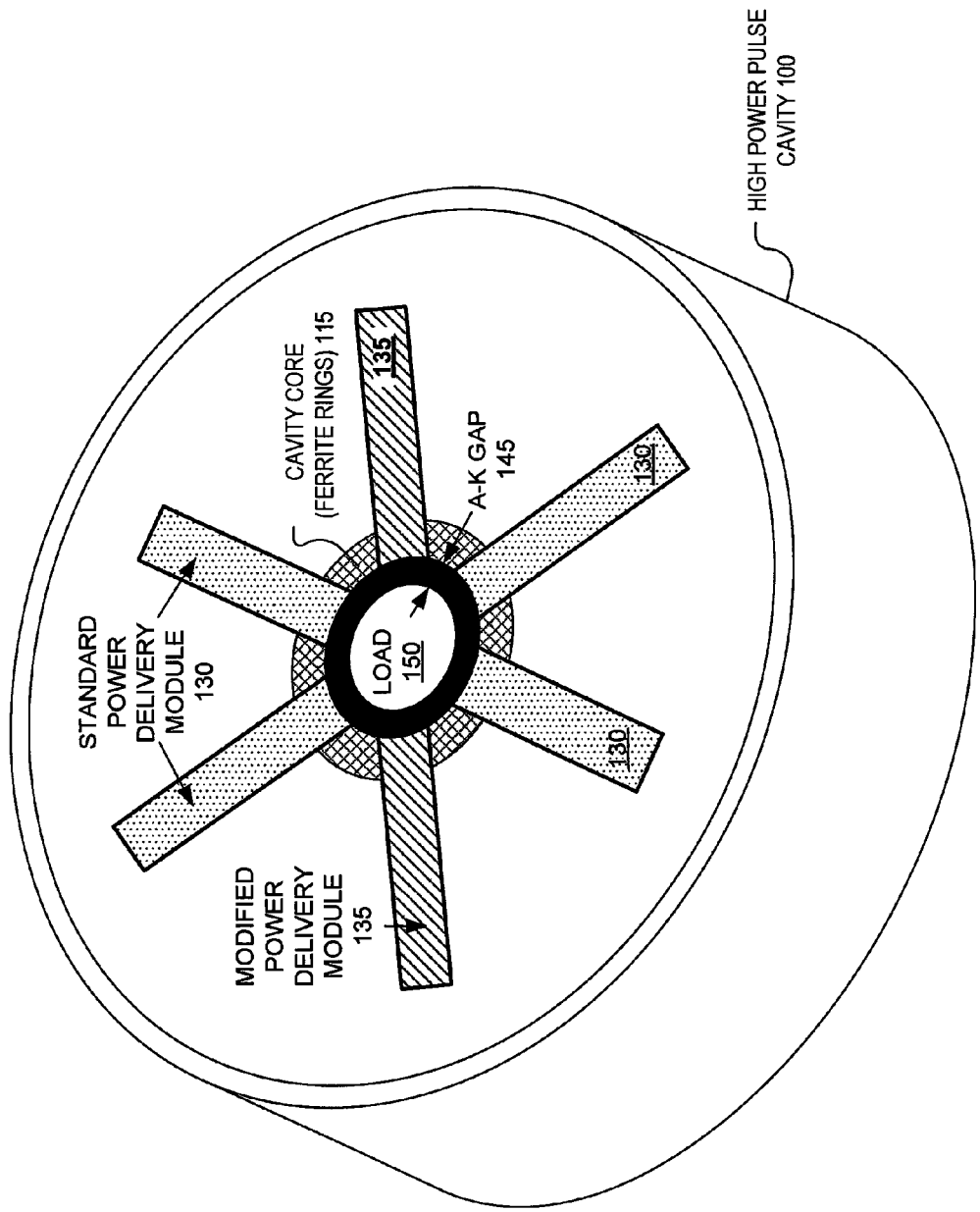
FIG. 1B illustrates an example HPPC that includes an array of standard power delivery modules ("SPDM") and an array of modified power delivery modules ("MPDM"), in accordance with an embodiment of the disclosure.

FIG. 1B illustrates an example HPPC 100 including standard power delivery module ("SPDM") 130 and modified power delivery module ("MPDM") 135. In one embodiment, an outer diameter of HPPC 100 is 204 cm. When HPPC 100 only includes power delivery modules 125 (as in FIG. 1A) that all generate pulses with the same frequency, the pulses are combined into a higher power pulse with that same frequency. The combined pulse may be substantially sinusoidal. However, in some applications, a pulse with a flatter top (e.g. a square pulse) than a sinusoidal waveform is desirable. Having an MPDM 135 connected in parallel with an SPDM 130 can generate a substantially flat-top pulse to be delivered to a particular load. Theoretical analysis and experiments indicate that having MPDM 135 configured to deliver a pulse that is approximately three times the frequency of a pulse delivered by SPDM 130 creates a pulse with a substantially flat top.

Figure 2:
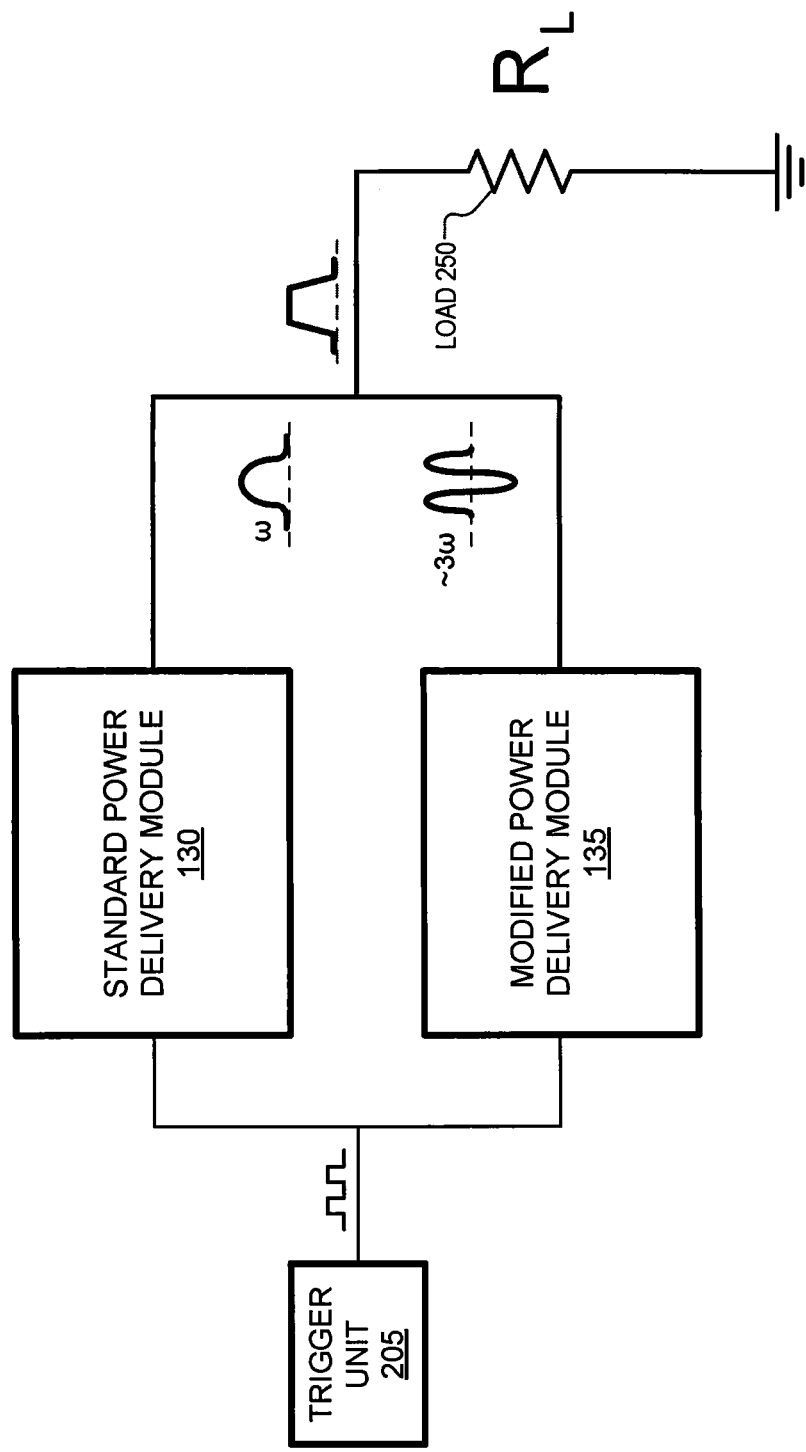
FIG. 2 shows an example block diagram including an SPDM generating a first pulse and an MPDM generating a second pulse that combines with the first pulse to form a pulse with a substantially flat-top, which is delivered to a load, in accordance with an embodiment of the disclosure.

FIG. 2 shows SPDM 130 connected in parallel with MPDM 135. SPDM 130 generates a pulse to be applied to a load, such as $R_L$ 250. MPDM 135 also generates a pulse to be applied to a load that is approximately three times the frequency of the pulse generated by SPDM 130. In the illustrated embodiment, trigger unit 205 is coupled to SPDM 130 and coupled to MPDM 135. Trigger unit 205 sends a trigger signal to SPDM 130 and to MPDM 135 to deliver a pulse to the load $R_L$ 250. Because the outputs of SPDM 130 and MPDM 135 are connected in parallel in FIG. 2, their pulses combine into a pulse with a relatively flat top. It is appreciated that although the load $R_L$ 250 is illustrated as a resistor, the load receiving the pulse may not be purely resistive.

Figure 3:
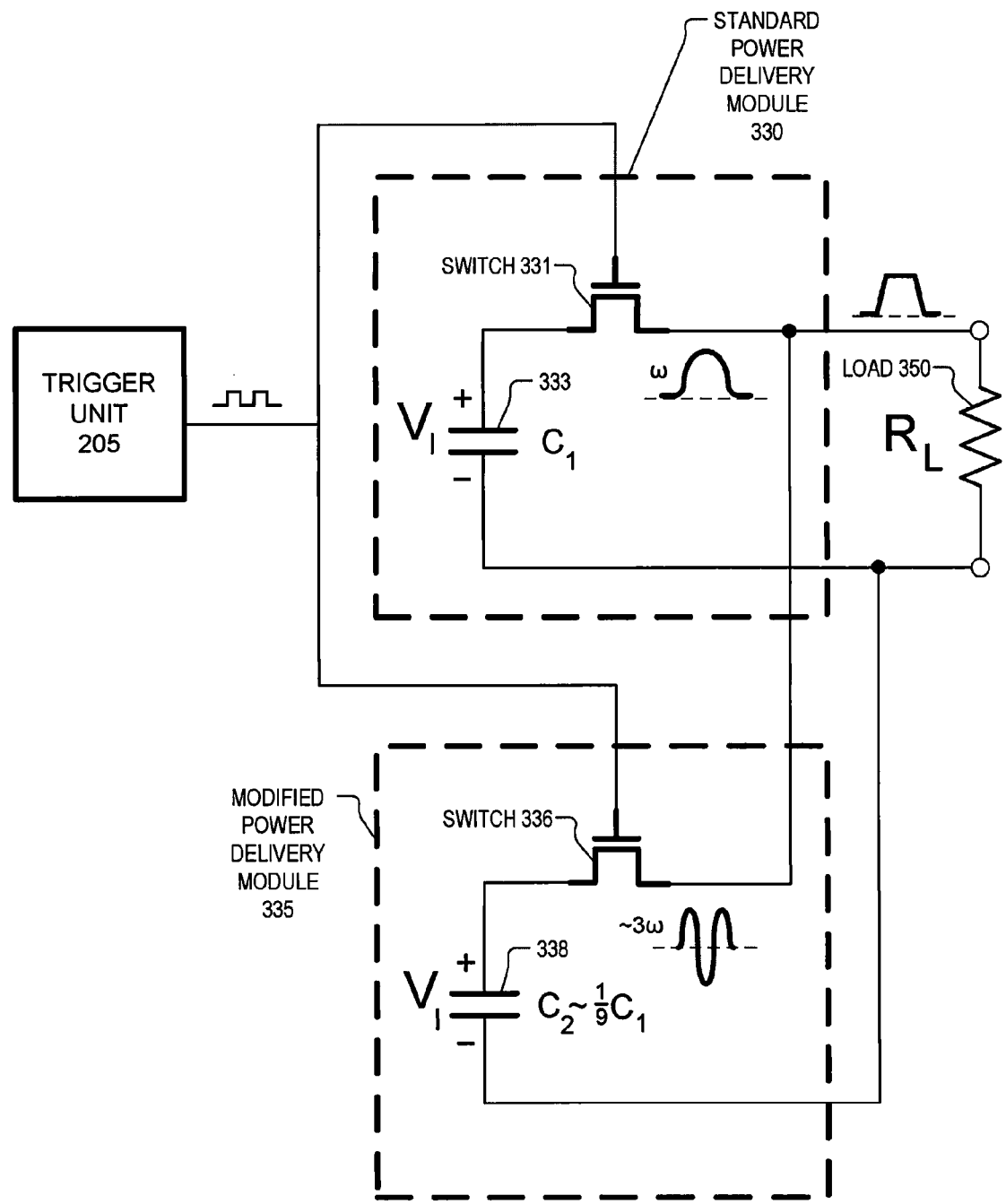
FIG. 3 shows an example block diagram illustrating one example configuration of a trigger unit, an SPDM, and an MPDM, in accordance with an embodiment of the disclosure.

FIG. 3 illustrates SPDM 330 as a possible example of SPDM 130 and MPDM 335 as a possible example of MPDM 135. SPDM 330 includes a charge storage device and a switch coupled to selectively transfer charge (in the form of a pulse) from the charge storage device to a load 350. MPDM 335 also includes a charge storage device and a switch coupled to selectively transfer charge (in the form of a pulse) from the charge storage device to the same load 350.

The illustrated embodiment of SPDM 330 includes a capacitor ($C_1$ 333) coupled to switch 331. $C_1$ 333 is charged to a voltage $V_1$ and switch 331 is activated by trigger unit 205 which allows $C_1$ 333 to discharge, generating a pulse to be delivered to load 350. The pulse may be an electromagnetic pulse and load 350 may not necessarily contact the conductors that deliver the pulse. The charging circuit and hardware that may be used to charge $C_1$ 333 is not shown as to not obscure the schematic. The frequency of the pulse delivered by SPDM 330 is $\omega$, as illustrated.

The illustrated embodiment of MPDM 335 includes a capacitor ($C_2$ 338) coupled to switch 336. $C_2$ 338 is charged to a voltage $V_1$ and switch 336 is activated by trigger unit 205, which allows $C_2$ 338 to discharge and generate a pulse to be delivered to load 350. In the illustrated embodiment, $C_2$ 338 and $C_1$ 333 are both charged to the same voltage ($V_1$), but they may be charged to different voltages. The charging circuit and hardware that may be used to charge $C_2$ 338 is not shown as to not obscure the schematic. The frequency of the pulse delivered by MPDM 335 is $\sim 3\omega$, as illustrated. Experiments and theory indicate that having MPDM 335 configured to deliver a pulse that is approximately three times the frequency of a pulse delivered by SPDM 330 creates a pulse with a substantially flat top. Although FIG. 3 does not depict a core (e.g. cavity core 115), those skilled in the art appreciate that a core may encircle conductors that are routed toward load 350.

In the illustrated embodiment, trigger unit 205 is coupled to switch 331 and 336 in parallel. In other examples, switch 331 and switch 336 may be coupled to trigger unit 205 individually, with separate conductors. In the illustrated embodiment, trigger unit 205 may broadcast a trigger signal to both switch 331 and switch 336, which will trigger SPDM 330 and MPDM 335 to deliver their pulses simultaneously. In other examples, switch 331 may receive a trigger signal from trigger unit 205 at a different time than switch 336 receives a trigger signal. Trigger unit 205 may be configured to deliver triggering signals (either analog or digital) to switch 331 and 336 at different times in order to stagger the pulses delivered to load 350 to achieve a desired waveform. It shall be appreciated that trigger unit 205 may also be connected to more than one (i.e. arrays) of SPDM 330 and MPDM 335 in order to orchestrate or synchronize the delivery of multiple pulses to load 350.

Figure 4:
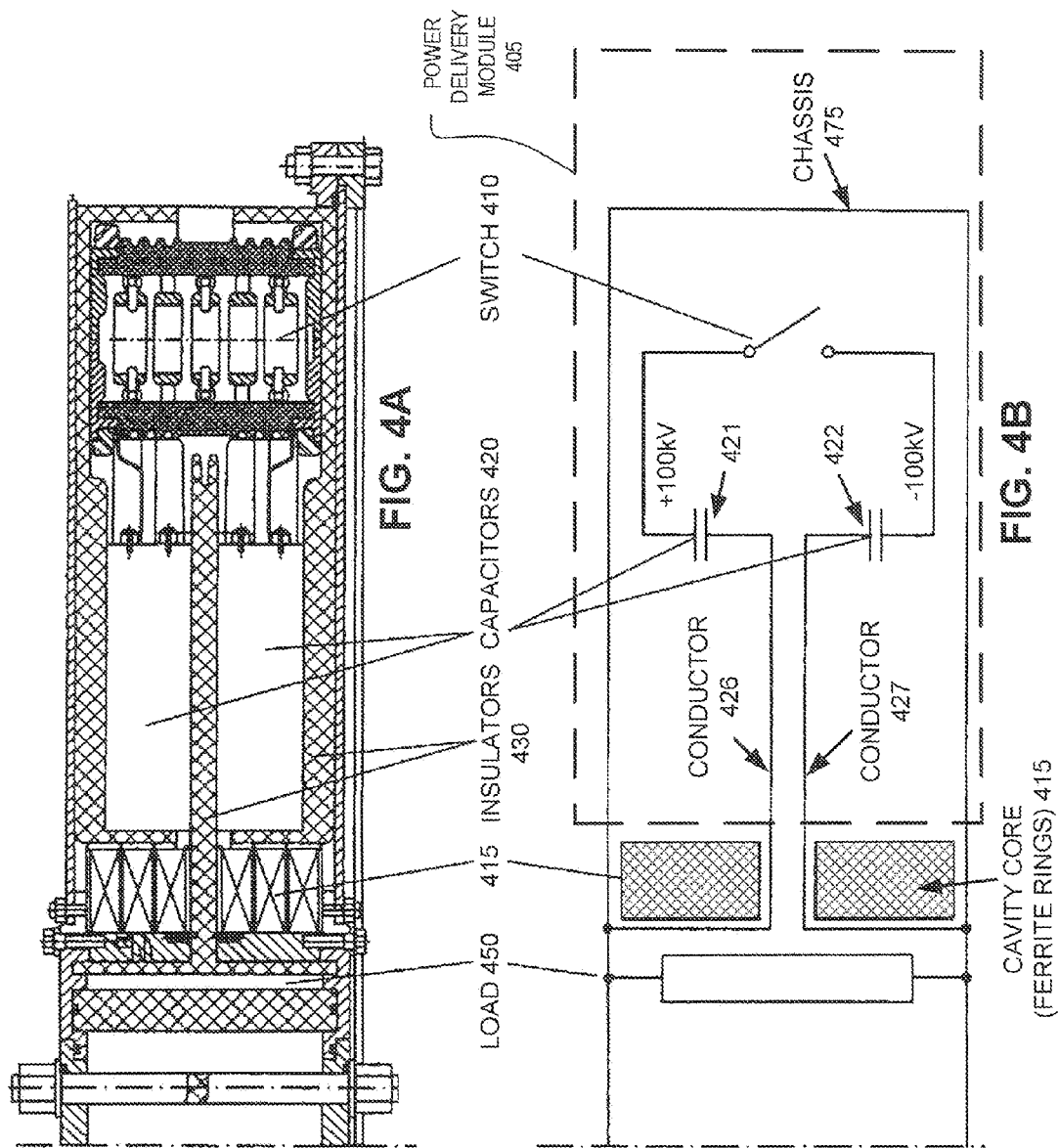
FIG. 4A illustrates a side section drawing of a power delivery module that includes a test load, in accordance with an embodiment of the disclosure.
FIG. 4B shows a block diagram schematic that corresponds with FIG. 4A, in accordance with an embodiment of the disclosure.

FIG. 4A illustrates a side section drawing of a power delivery module that includes a test load, in accordance with an embodiment of the disclosure. All or a portion of the structure illustrated in FIG. 4A may be used in the respective SPDMs and MPDMs. FIG. 4A shows load 450 as a liquid resistor, which can be used for test and measurement purposes. However, it is appreciated that illustrated load 450 resistor may be replaced with a different load that receives electromagnetic pulses and does not necessarily receive power by virtue of being wired to conductors.

FIG. 4A includes a cavity core 415, insulators 430, capacitors 420, and a switch 410. In the illustrated embodiment, cavity core 415 includes six ferrite rings. Three of the ferrite rings (each illustrated by an "X" within a rectangle) are positioned below the portion of insulator 430 that separates capacitors 420. Still referring to the illustrated embodiment, three of the ferrite rings in cavity core 415 are positioned below the portion of insulator 430 that separates capacitors 420.

FIG. 4B shows a block diagram schematic that corresponds with FIG. 4A, in accordance with an embodiment of the disclosure. FIG. 4B includes a power delivery module 405 that includes switch 410, capacitors 420, conductor 426, and conductor 427. FIG. 4B also shows cavity core 415. In one embodiment, cavity core 415 includes a first ferrite ring stacked co-axially with a second ferrite ring with an insulator 430 separating the first ferrite ring and the second ferrite ring.

In the illustrated embodiment, cavity core 415 includes a first group of three ferrite rings stacked co-axially with a second group of three ferrite rings with insulator 430 separating the two stacks. The cavity core may be made of ET3425 iron tape with a thickness $\delta = 50\text{-}80$ μm. In one embodiment, the length of its centerline (measured as the length of the core mean circumference) is 1~1.2 m. In the illustrated embodiment, the total cross section of iron in the six rings is $S \sim 53$ cm$^2$. At passive pre-magnetization, the volt-second integral of this core may be $VS_{CORE} \sim 17$ mV s.

Charging circuitry (not shown) may charge capacitor 421 to a first voltage (e.g. 100 kV) and charge capacitor 422 to a second voltage (e.g. −100 kV). Switch 410 is coupled in series between capacitor 421 and capacitor 422. Capacitor 421 and capacitor 422 are configured to deliver a pulse to the load via conductor 426 and conductor 427. Capacitors 421 and 422 may have the same capacitance. In the illustrated embodiment, conductor 426 is routed from capacitor 426, through the first (top) stack of ferrite rings, to a chassis 475. Also in the illustrated embodiment, conductor 427 is routed from capacitor 422, through the second (bottom) stack of ferrite rings, to chassis 475. The first ferrite ring and the second ferrite ring are positioned to force the pulse to load 450 by temporarily isolating the pulse from an electrical ground. In other words, the first ferrite ring and the second ferrite ring may act as a "choke" to the pulse.

Chassis 475 may be a steel chassis that is substantially doughnut shaped. Chassis 475 may be at ground potential at all times. Capacitor 421 and capacitor 422 are configured to deliver a pulse to the load (when switch 410 closes), where the pulse includes the energy stored in capacitors 421 and 422 by the charging circuitry. In one embodiment, TDK ceramic capacitors are used in an MPDM of power delivery module 405 and GA 35460 oil-filled capacitors are used in a SPDM of power delivery module 405. Other capacitors may be used.

Figure 5:
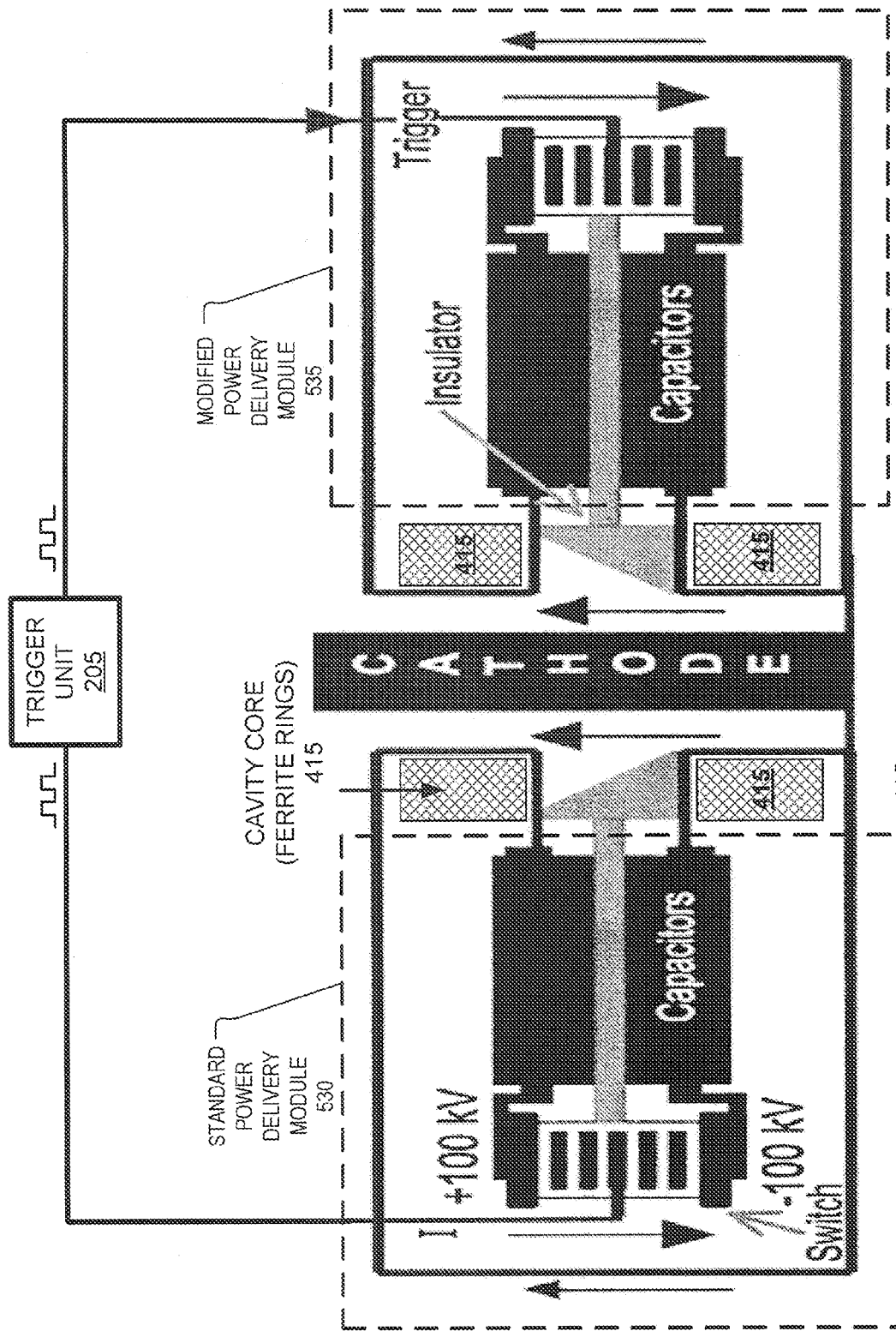
FIG. 5 illustrates a block diagram of a side section of an SPDM, an MPDM, and an example load, in accordance with an embodiment of the disclosure.

FIG. 5 illustrates a block diagram of a side section of an SPDM 530, an MPDM 535, and an example load, in accordance with an embodiment of the disclosure. SPDM 530 and MPDM 535 may be examples of SPDM 130 and MPDM 135, respectively. In FIG. 5, instead of a wired resistor (e.g. load 450), the load is now the coaxial line formed by the inner cylindrical surface of a cavity (e.g. HPPC 100) and a central (cathode) cylindrical electrode. The pulses from SPDM 530 and MPDM 535 are applied across an insulator that separates the anode and cathode output electrodes (A-K gap) of the cavity.

In one embodiment, trigger unit 205 is coupled to transmit a trigger signal to the switch in SPDM 530 and to the switch in MPDM 535. The trigger signal may be sent to both switches simultaneously. In one embodiment, the trigger signal is a trigger pulse of 100 kV. This trigger pulse arrives into the middle plane of the switches, which causes the switches to close and the capacitors in both SPDM 530 and MPDM 535 to discharge toward the walls (e.g. chassis 475) of the cavity (e.g. HPPC 100), which is grounded at all times. The pulse formed by the energy discharge of the capacitors of SPDM 530 combines with the pulse formed by the energy discharge of the capacitors of MPDM 535 to form a combined pulse. The combined pulse may have a substantially flat-top because of the combination of the SPDM pulse ($\omega$) and the MPDM pulse (~3$\omega$)). The ferromagnetic cavity core 415 has the appropriate cross-sectional area to block the pulse from going to ground (chassis) and forcing it to be applied across a plastic insulator of the A-K gap for a duration between 75 and 200 ns. This induces an opposite sign pulse on the cathode electrode, which propagates upstream through the coaxial transmission line. When the core saturates, any remaining energy goes to ground. In FIG. 5, arrows show the current direction in each conductor.

In order to achieve a fast rise time output pulse (e.g. ~70-150 ns), the inductance of each power delivery module may need to be kept as low as possible. The inductance of each power delivery module 405 is the sum of the inductance of capacitor 421 and capacitor 422, the inductance of switch 410, the inductance of the connection between each capacitor and switch 410, and the inductance of the conductors 426 and 427. Switch 410 and capacitors 421 and 422 may be connected with circuit bushes with an inductance of ~60 nH. In one embodiment, the circuit bushes are made from aluminum plates. Conductors 426 and 427 may also be aluminum plates and complete the circuit loop by bringing the output pulse of a power delivery module 405 to load 450 or to the anode or cathode electrode of the A-K gap. Capacitors 421 and 422 may each have an inductance of ~50 nH and switch 410 may have an inductance of ~120 nH. The total inductance of each power delivery module 405 up to the ferromagnetic core 415 may be ~230 nH. SPDM 530 and MPDM 535 may also have a total inductance of approximately ~230 nH.

Still referring to FIG. 5, a first conductor is routed from a top capacitor in SPDM 530, through the first (top) stack of ferrite rings, to a chassis. A second conductor is routed from a bottom capacitor in SPDM 530, through the second (bottom) stack of ferrite rings, to the chassis. Also in the illustrated embodiment, a third conductor is routed from a top capacitor in MPDM 535, through the first stack of ferrite rings, to the chassis. A fourth conductor is routed from a bottom capacitor in MPDM 535, through the second stack of ferrite rings, to the chassis. In one embodiment (not shown), the first conductor and the third conductor may be joined together for at least a portion of their respective routings. In one embodiment (not shown), the second conductor and the fourth conductor are joined together for at least a portion of their respective routings.

As discussed above, to achieve a substantially flat-top pulse, the MPDMs may be configured to deliver a pulse that is approximately three times the frequency as a pulse delivered by the SPDMs. The idea of the flat-top (Square Pulse) LTD is based on the Fourier theorem, which states that any waveform can be reproduced by the superposition of a series of sine and cosine waves. In particular, the constant function $f(x)$ for $0 \leq x \leq \pi$ defined as $$f(x) = \frac{\pi}{4}, \tag{1}$$

can be reproduced as follows $$f(x) = \sum_{p=1}^{p_{max}} \frac{\sin(2p-1)x}{2p-1}, \tag{2}$$

where $p_{max} = \infty$. For $p_{max} = 2$, the equation (2) can be represented in the form $$f_2(x) = \sin x + \frac{1}{a}\sin 3x, \tag{3}$$

where a=3. If a in Eq. (3) increases from 3 to ~9, the top of the pulse flattens.

If the function $f_2(x)$ is the current in the load, in order to produce this current pulse the driving circuit (e.g. a combination of MPDMs and SPDMs.) has to deliver to the load two sine pulses with different frequencies, $\omega_1$ and $\omega_2 \sim 3\omega_1$. The amplitude of the current pulse with the frequency $\omega_2$ must be less than the one with the frequency $\omega_1$. The LTD architecture is convenient for this kind of pulse shaping because each cavity (e.g. HPPC 100) may include multiple power delivery modules connected in parallel. The output LTD pulse can have a flat top if the power delivery modules in the cavity are of two different kinds (e.g. SPDMs and MPDMs). SPDMs deliver the main sinusoidal pulse into the load, and MPDMs deliver a pulse that helps flatten the top of the main sinusoidal pulse.

Figure 6:
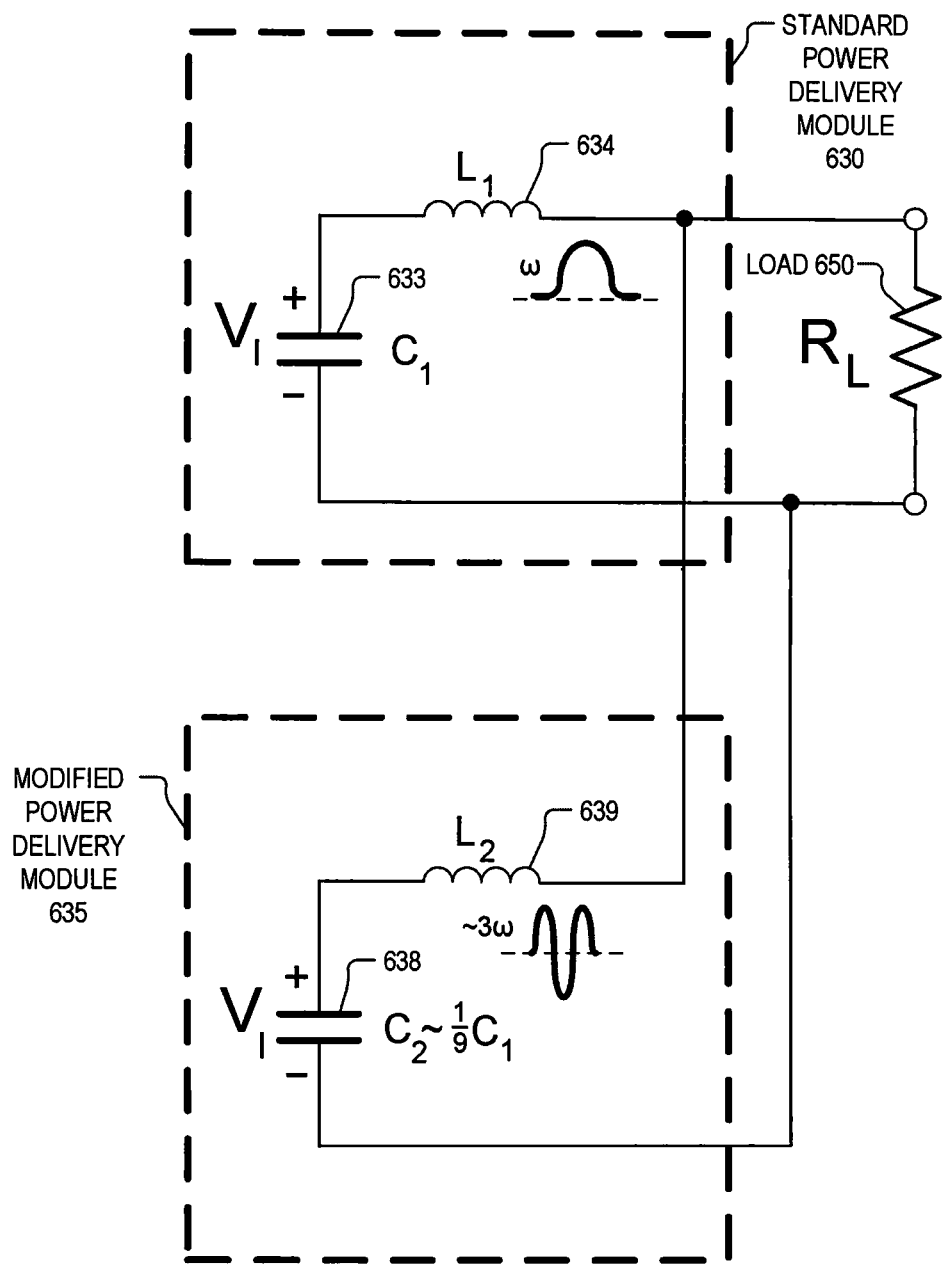
FIG. 6 shows a block diagram schematic that models the electrical characteristics of an example SPDM and an example MPDM, in accordance with an embodiment of the disclosure.

The simplified block diagram electrical circuit that models the electrical characteristics of an example SPDM (e.g. SPDM 330 and 530) and an example MPDM (e.g. MPDM 335 and 535) is shown in FIG. 6. FIG. 6 includes standard capacitor ($C_1$) 633 and standard inductor ($L_1$) 634 that model the respective capacitance and inductance of SPDM 630. FIG. 6 also includes modified capacitor ($C_2$) 638 and modified inductor ($L_2$) 639 that model the respective capacitance and inductance of MPDM 635. SPDM 630 is connected in parallel with MPDM 635 to deliver a flat-top pulse to load ($R_L$) 650.

FIG. 6 may also be an appropriate model for an LTD that has an array of SPDMs 630 and an array of MPDMs 635 connected in parallel to deliver a pulse to load 650. To model that case, standard capacitor 633 would be multiplied by s (which signifies the number of SPDMs 630 in the array) and standard inductor 634 would be divided by s. Also in that case, modified capacitor 638 would be multiplied by m (which signifies the number of MPDMs 635 in the array) and modified inductor 639 would be divided by m.

If it is assumed that SPDM 630 is matched to the cavity load, the following conditions may assist in describing the circuit model in FIG. 6:

$$\sqrt{\frac{L_1/s}{sC_1}} = \frac{1}{s}\sqrt{\frac{L_1}{C_1}} = \frac{1}{s}\rho_1 \sim R_L, \quad (4)$$

where $$\rho_1 = \sqrt{\frac{L_1}{C_1}}$$

is the circuit impedance of SPDM 630.

As discussed above, to flatten the output pulse top, the circuit frequency of MPDM 635 may be approximately three times that of SPDM 630, resulting in $$\sqrt{L_1 C_1} \sim 3\sqrt{L_2 C_2}. \quad (5)$$

If power delivery modules are designed to keep inductance low (in order to achieve fast pulses), the inductance ($L_1$ 634 and $L_2$ 639) of both power delivery modules may be approximately the same $$L_2 \sim L_1. \quad (6)$$

Based on Equations (5) and (6) an estimate for the capacitance of an MPDM as a function of the capacitance of an SPDM is $$C_2 \sim \frac{1}{9}C_1. \quad (7)$$

Simulations show that if the conditions (4)-(6) are satisfied, the standard and modified power delivery modules discharge into the load $R_L$ as if they were almost independent of each other. Then the amplitude of the current delivered by s SPDM into the matched load $R_L$ is $$I_1 \sim 0.5\frac{V}{\rho_1}s. \quad (8)$$

While the amplitude of the current $I_2$ delivered by the m (<s) MPDMs into the load $$R_L \sim \frac{\rho_1}{s} \sim \frac{m}{3s}\frac{\rho_2}{m} < 0.33\frac{\rho_2}{m},$$

is $$I_2 \sim 0.9\frac{V}{\rho_2}m. \quad (9)$$

This is because the load that the MPDMs see, $R_L$, is much smaller (under matched) than their characteristic impedance $$\rho_2 = \sqrt{\frac{L_2}{C_2}}.$$

Equations (5)-(9) indicate that the shape of the load pulse (defined by the coefficient a in Eq. (3)) depends on the ratio of the number of standard and modified power delivery modules in the cavity, because $$a = \frac{I_1}{I_2} \sim 0.55\frac{\rho_2}{\rho_1}\frac{s}{m} \sim 1.65\frac{s}{m}. \quad (10)$$

Although Equation (10) indicates that coefficient a is theoretically ~1.65 (s/m), Equation (10) may need to be modified depending on real-world factors. In one embodiment where TDK ceramic capacitors are used in a power delivery module, Equation (10) may be modified to $$a \sim 3\frac{s}{m}. \quad (11)$$

Factors such as resistance in capacitors may require Equation (10) to be adjusted to accommodate a specific physical embodiment. Energy losses associated with the core (e.g. cavity core 415) may also require the tuning of Equation (10) to achieve the desire flat-top pulse waveform. Some simulations indicate that the top of the combined output pulse may rise or fall depending on the inductance of the MPDMs. This may be because at a given load resistance, this inductance determines the amplitude of a second current peak produced by the MPDMs coupled to the load.

As shown in Equation (7), the calculated capacitance of the MPDMs may be about $\frac{1}{9}^{th}$ the capacitance of the SPDMs to achieve a flat-top pulse waveform to deliver to the load of an LTD. Because real-world factors may require a slightly different capacitance ratio, a capacitance of the MPDMs between eight and twelve times the capacitance of the SPDMs may be used to achieve a flat-top pulse waveform to deliver to the load. A capacitance ratio between eight and twelve may correspond with the SPDMs and the MPDMs having approximately the same inductance. This capacitance ratio with substantially the same inductance may configure the MPDMs to generate a pulse with a frequency approximately three times the frequency of a pulse delivered by the SPDMs. Also discussed above, the ratio of modified to standard power delivery modules in a cavity (e.g. HPPC 100) may define the shape of the combined output pulse delivered to the load. It is appreciated that a number of SPDMs and MPDMs may be connected in parallel in a cavity and triggered simultaneously to generate a combined pulse to be delivered to a load.

In one embodiment, HPPC 100 contains s=4 SPDMs 130 and m=2 MPDMs 135. However, because the shape of the load pulse depends on the ratio of the number of SPDMS to the number of MPDMs included in HPPC 100, the ratio may change depending on the specific application and desired shape of the load pulse. The specific configuration of SPDM 130 and MPDM 135 may take the form of SPDMs and MPDMs described in accordance with the disclosure.

If the SPDM and MPDM are configured similar to those in FIGS. 4A and 4B, the bottom capacitor (e.g. capacitor 422) of each SPDM and MPDM may be positioned in a bottom circular array and the top capacitors (e.g. capacitor 421) may be positioned in the cavity as a top circular array. In one embodiment, the top circular array is separated from the bottom circular array by a ~1 cm plastic insulator plate. The capacitors in the top circular array may be charged to a first voltage (e.g. 100 kV) and the bottom circular array may be charged to a second voltage (e.g. −100 kV).

In one embodiment, each SPDM and MPDM includes a multi-gap switch (e.g. switch 410) with corona discharge that is used to fire each power delivery module simultaneously. In one embodiment, the switches use dry air. The gas switches may be relatively quiet, which reduces mechanical shock that can significantly shorten the life of an assembly. In another embodiment, a different switch design may be used having only one or several gaps. Also, the switch gas may be different than dry air—it may be hydrogen or other suitable gas.

Figure 7:
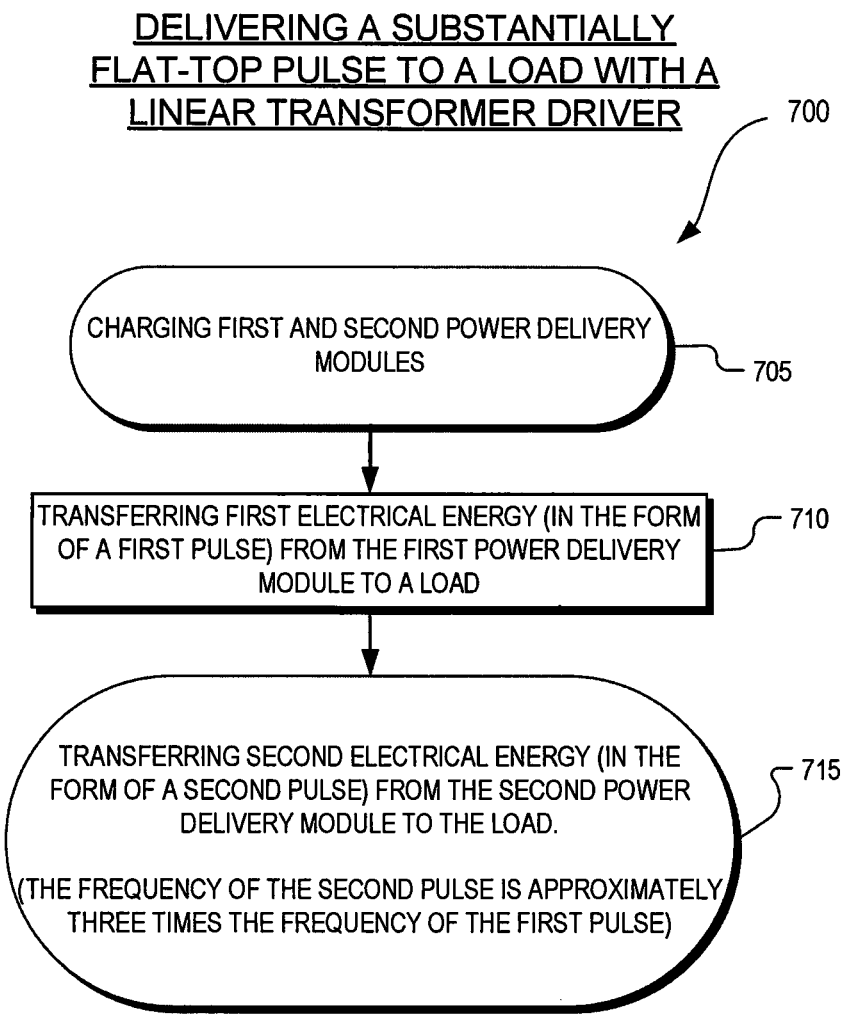
FIG. 7 illustrates a flowchart of an example process of operating a linear transformer driver, in accordance with an embodiment of the disclosure.

FIG. 7 illustrates a flowchart of an example process 700 for operating an LTD, in accordance with an embodiment of the disclosure. The order in which some or all of the process blocks appear in process 700 should not be deemed limiting. Rather, one of ordinary skill in the art having the benefit of the present disclosure will understand that some of the process blocks may be executed in a variety of orders not illustrated, or even in parallel.

In process block 705, first and second power delivery modules (e.g. SPDM and MPDM) are charged. The first power delivery module is charged to a first electrical energy level and the second power delivery module is charged to a second electrical energy level. In one embodiment, the first and second energy level is approximately the same. Charging circuitry may be connected in parallel to charge the first and second power delivery modules to approximately the same level. The first and second power delivery module may each contain one or two charge storage devices, as shown in the embodiments depicted in FIG. 3 and FIG. 4A-4B. If the first and second power delivery modules are configured similar to the embodiment in FIG. 4A-4B, one capacitor (e.g. capacitor 421) may be charged to a first voltage level (e.g. 100 kV) and a second capacitor (e.g. capacitor 422) may be charged to a second voltage level (e.g. ~100 kV).

In process block 710, first electrical energy is transferred from the first power delivery module to a load, in the form of a first pulse. In process block 715, the second electrical energy is transferred from the second power delivery module to the load, in the form of a second pulse. The first pulse has a first frequency and the second pulse has a second frequency approximately three times the first frequency. The first pulse and the second pulse combine to deliver a pulse with a substantially flat top to the load. A ferrite core that encircles conductors that deliver the first and second pulses may act as a choke and force the pulses to be delivered to the load electromagnetically by temporarily delaying the first and second pulse from going to ground.

The first and second electrical energy may be transferred simultaneously. The first power delivery module and the second power delivery module may receive a trigger signal causing the first pulse and the second pulse to propagate to the load simultaneously. The first power delivery module may include a first switch coupled to transfer the first electrical energy to the load, and the second power delivery module may include a second switch coupled to transfer the second electrical energy to the load.

One additional process block of process 700 may include pressurizing the first switch and the second switch with refrigerated air prior to transferring the first electrical energy and the second electrical energy to the load. Another additional process block of process 700 may include de-magnetizing the ferrite core after transferring the first electrical energy and the second electrical energy.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible non-transitory machine-readable storage medium includes any mechanism that provides (i.e., stores) information in a form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A linear transformer driver comprising:
a core including a first ferrite ring and a second ferrite ring positioned to accept a load within a center of the first ferrite ring and the second ferrite ring;
a first array of first power delivery modules, wherein each of the first power delivery modules includes a first switch coupled in series between a first capacitor having a first capacitance and a second capacitor having a second capacitance; and
a second array of second power delivery modules, wherein each of the second power delivery modules includes a second switch coupled in series between a third capacitor having a third capacitance and a fourth capacitor having a fourth capacitance, wherein the first capacitor and the second capacitor are coupled to deliver a first pulse having a first frequency to the load, and wherein the third capacitor and the fourth capacitor are coupled to deliver a second pulse having a second frequency to the load, the second frequency approximately three times the first frequency and the core positioned to force the first pulse and the second pulse to the load by temporarily isolating the first pulse and the second pulse from an electrical ground.

2. The linear transformer driver of claim 1, wherein a sum of the first capacitance and the second capacitance is between eight and twelve times a second sum of the third capacitance and the fourth capacitance.

3. The linear transformer driver of claim 2, wherein the first capacitance and the second capacitance are substantially the same, and wherein the third capacitance and the fourth capacitance are substantially the same.

4. The linear transformer driver of claim 2, wherein a first inductance of the first power delivery module and a second inductance of the second power delivery module are substantially the same.

5. The linear transformer driver of claim 1, wherein a first conductor is routed from the first capacitor, through the first ferrite ring, to a chassis, and wherein a second conductor is routed from the second capacitor, through the second ferrite ring, to the chassis, wherein a third conductor is routed from the third capacitor, through the first ferrite ring, to the chassis, and wherein a fourth conductor is routed from the fourth capacitor, through the second ferrite ring, to the chassis.

6. The linear transformer driver of claim 5, wherein the first pulse and the second pulse combine to form an electromagnetic pulse delivered to the load.

7. The linear transformer driver of claim 6, wherein the chassis is a substantially doughnut-shaped metal chassis that encloses the first array of the first power delivery modules and the second array of the second power delivery modules, and wherein the first ferrite ring and the second ferrite ring encircle an inner cylindrical surface of the substantially doughnut-shaped metal chassis.

8. The linear transformer driver of claim 7, wherein the electromagnetic pulse is delivered to the load across an anode-cathode gap between the inner cylindrical surface of the substantially doughnut-shaped metal chassis and the load, wherein the load is a cylindrical electrode.

9. The linear transformer driver of claim 5, wherein the first conductor and the third conductor are joined together for at least a portion of their respective routing, and wherein the second conductor and the fourth conductor are joined together for at least a second portion of their respective routing.

10. The linear transformer driver of claim 1, wherein the first capacitor and the third capacitor are coupled to be charged to a first voltage by charging circuitry, and wherein the second capacitor and the fourth capacitor are coupled to be charged to a second voltage by the charging circuitry, the first voltage and the second voltage having opposite polarities.

11. The linear transformer driver of claim 1 further comprising a trigger unit coupled to transmit a trigger signal to the first switch and the second switch.

12. The linear transformer driver of claim 1, wherein the first ferrite ring is stacked co-axially with the second ferrite ring.

13. A linear transformer driver comprising:
at least one ferrite ring positioned to accept a load within a center of the at least one ferrite ring;
a first power delivery module including a first charge storage device and a first switch coupled to selectively transfer a first charge, in the form of a first pulse, from the first charge storage device to a first conductor routed to deliver a first energy from the first pulse to the load, wherein the first pulse has a first frequency; and
a second power delivery module including a second charge storage device and a second switch coupled to selectively transfer a second charge, in the form of a second pulse, from the second charge storage device to a second conductor routed to deliver a second energy from the second pulse to the load, wherein the at least one ferrite ring is positioned to electromagnetically transfer the first energy and the second energy to the load, and wherein the second pulse has a second frequency approximately three times the first frequency.

14. The linear transformer driver of claim 13, wherein a first capacitance of the first charge storage device is between eight and twelve times a second capacitance of the second charge storage device, and a first inductance of the first power deliver module is approximately equal to a second inductance of the second power delivery module.

15. The linear transformer driver of claim 13, wherein the at least one ferrite ring is configured to be saturated by the first energy from the first pulse and the second energy from the second pulse for between 75 and 200 ns.

16. A method of delivering a substantially flat-top pulse to a load with a linear transformer driver, the method including:
charging a first power delivery module to a first electrical energy level and charging a second power delivery module to a second electrical energy level;
transferring the first electrical energy from the first power delivery module to a load via a first pulse; and
transferring the second electrical energy from the second power delivery module to the load via a second pulse, wherein the first pulse has a first frequency and the second pulse has a second frequency approximately three times the first frequency.

17. The method of claim 16, wherein the first power delivery module includes at least a first capacitor to store the first electrical energy, and wherein the second power delivery module includes at least a second capacitor to store the second electrical energy.

18. The method of claim 16, wherein the first power delivery module and the second power delivery module receive a trigger signal causing the first pulse and the second pulse to propagate to the load simultaneously.

19. The method of claim 18, wherein the trigger signal switches a first switch of the first power delivery module that is coupled to transfer the first electrical energy to the load, and wherein the trigger signal switches a second switch of the second power delivery module that is coupled to transfer the second electrical energy to the load.

20. The method of claim 19 further comprising:
pressurizing the first switch and the second switch with refrigerated air prior to transferring the first electrical energy and the second electrical energy to the load.

21. The method of claim 16 further comprising:
de-magnetizing a ferrite core after transferring the first electrical energy and the second electrical energy to the load.

* * * * *